United States Patent
Udagawa

(10) Patent No.: US 6,809,346 B2
(45) Date of Patent: Oct. 26, 2004

(54) BORON PHOSPHIDE-BASED SEMICONDUCTOR LIGHT-EMITTING DEVICE, PRODUCTION METHOD THEREOF, AND LIGHT-EMITTING DIODE

(75) Inventor: Takashi Udagawa, Saitama (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/795,302

(22) Filed: Mar. 9, 2004

(65) Prior Publication Data

US 2004/0169191 A1 Sep. 2, 2004

Related U.S. Application Data

(63) Continuation of application No. 10/353,006, filed on Jan. 29, 2003, now Pat. No. 6,730,941.
(60) Provisional application No. 60/384,097, filed on May 31, 2002.

(30) Foreign Application Priority Data

Jan. 30, 2002 (JP) .................................. P2002-020824

(51) Int. Cl.[7] ..................... H01L 33/00; H01L 29/06; H01L 31/0328; H01L 21/10
(52) U.S. Cl. ..................... 257/99; 257/13; 257/91; 257/94
(58) Field of Search ..................... 257/12–13, 79–103; 438/22, 24, 28–29, 34, 46–47

(56) References Cited

U.S. PATENT DOCUMENTS

| | | |
|---|---|---|
| 5,042,043 A | 8/1991 | Hatano et al. |
| 5,563,422 A | 10/1996 | Nakamura et al. |
| 6,069,021 A | 5/2000 | Terashima et al. |
| 6,417,525 B1 | 7/2002 | Hata |
| 6,420,731 B1 | 7/2002 | Katayama et al. |
| 6,420,736 B1 | 7/2002 | Chen et al. |
| 6,486,500 B1 | 11/2002 | Chen |
| 2002/0173062 A1 | 11/2002 | Chen et al. |

FOREIGN PATENT DOCUMENTS

| | | |
|---|---|---|
| JP | 2-275682 A | 11/1990 |
| WO | WO 02/097861 A2 | 12/2002 |

Primary Examiner—Shouxiang Hu
(74) Attorney, Agent, or Firm—Sughrue Mion, PLLC

(57) ABSTRACT

A boron-phosphide-based semiconductor light-emitting device having a semiconductor substrate of a first conduction type having, on its bottom surface, a bottom electrode; a first boron-phosphide-based semiconductor layer of a first conductive type provided on the substrate; a Group III–V compound semiconductor active layer provided on the first boron-phosphide-based semiconductor layer; a second boron-phosphide-based semiconductor layer of second conduction type provided on the active layer; and a top electrode provided on the surface of the second boron-phosphide-based semiconductor layer. The top electrode includes a lower electrode and an upper electrode, the lower electrode is in direct contact with the second boron-phosphide-based semiconductor layer and formed of a metal incapable of establishing ohmic contact with the second boron-phosphide-based semiconductor layer, and the upper electrode is provided on the lower electrode and formed of a metal capable of establishing ohmic contact with the second boron-phosphide-based semiconductor layer.

5 Claims, 3 Drawing Sheets

BORON PHOSPHIDE-BASED SEMICONDUCTOR LIGHT-EMITTING DEVICE, PRODUCTION METHOD THEREOF, AND LIGHT-EMITTING DIODE

CROSS-REFERENCE TO RELATED APPLICATIONS

This is a Continuation of U.S. application Ser. No. 10/353,006, filed Jan. 29, 2003, now U.S. Pat. No. 6,730,941 which claims benefit of Provisional Application 60/384,097, filed May 31, 2002, the above-noted applications incorporated herein by reference.

BACKGROUND OF THE INVENTION

The present invention relates to a boron-phosphide-based semiconductor light-emitting device including a semiconductor substrate, a boron-phosphide-based semiconductor layer formed on the substrate, and an active layer formed of a Group III–V compound semiconductor. Particularly, the present invention relates to a boron-phosphide-based semiconductor light-emitting device which has an improved electrode structure and exhibits high emission intensity.

Conventionally, techniques for producing semiconductor light-emitting devices (e.g., a light-emitting diode (LED) and a laser diode (LD)) incorporating a layer formed of boron phosphide (BP), which is a Group III–V compound semiconductor (see U.S. Pat. No. 6,069,021) have been proposed. A conventional boron-phosphide-based semiconductor light-emitting device has a stacked layer structure including a substrate formed of, for example, single-crystal silicon, and a boron phosphide layer which is formed on the substrate and serves as a buffer layer (see U.S. Pat. No. 6,069,021). Recently, a stacked layer structure employed for producing semiconductor light-emitting devices, which includes a light-emitting portion of a pn-junction-type double hetero structure including a wide-band-gap boron phosphide layer serving as a cladding layer (see Japanese Patent Application No. 2001-158282) has been proposed.

A conventional boron-phosphide-based semiconductor light-emitting device incorporating an electrically conductive silicon substrate includes a bottom electrode provided on the bottom surface of the silicon substrate, and a top electrode provided on a top layer constituting a stacked layer structure similar to that described above. The top electrode or bottom electrode is formed of a metallic material capable of establishing ohmic contact with an n-type or p-type semiconductor layer on which the electrode is provided (see Japanese Patent Application Laid-Open (kokai) No. 2-275682). Regarding the boron-phosphide-based semiconductor light-emitting device incorporating the silicon substrate, a technique for forming a top positive electrode on a contact layer formed of a p-type conductive boron phosphide layer has been proposed (see Japanese Patent Application Laid-Open (kokai) No. 2-275682).

In a light-emitting device such as an LED or an LD, a top electrode generally has an electrical polarity opposite that of a bottom electrode, and a negative electrode is provided on an n-type semiconductor layer and formed of a metal capable of establishing ohmic contact with the n-type semiconductor layer. In a conventional boron-phosphide-based semiconductor light-emitting device, a portion of an electrode that is in contact with a p-type or n-type semiconductor layer consists of a metal capable of establishing ohmic contact with the p-type or n-type semiconductor layer. In a boron-phosphide-based semiconductor device (particularly, a light-emitting device) including an electrically conductive silicon substrate, when a portion of an electrode that is in contact with a p-type or n-type semiconductor layer is formed of a metal capable of establishing ohmic contact with the semiconductor layer, current for operating the light-emitting device is advantageously caused to flow between top and bottom electrodes.

However, in a boron-phosphide-based semiconductor light-emitting device, when a semiconductor layer on which a top electrode is formed has a thickness and a resistivity such that operation current is insufficiently diffused therein in a horizontal direction, the operation current preferentially flows to a region of a light-emitting portion that is located just below the top electrode, and the operation current fails to be diffused throughout the light-emitting portion. That is, when operation current is caused to flow, light is emitted from merely the region of the light-emitting portion that is located just below the top electrode. In addition, since light emitted from the region located just below the top electrode is shielded by the electrode, difficulty is encountered in extracting the emitted light from the device. Therefore, the boron-phosphide-based semiconductor light-emitting device which exhibits high luminance can be hardly obtained.

SUMMARY OF THE INVENTION

An object of the present invention is to provide a boron-phosphide-based semiconductor light-emitting device (LED) including a boron-phosphide-based semiconductor layer serving as a cladding layer, and a top electrode having a structure such that the operation current can be caused to flow to a wide region of a light-emitting portion from which light is advantageously emitted, not just to a region located below the top electrode.

Accordingly, the above object of the present invention has been achieved by providing the following.

(1) A boron-phosphide-based semiconductor light-emitting device comprising a semiconductor substrate of a first conduction type having, on its bottom surface, a bottom electrode; a first boron-phosphide-based semiconductor layer of a first conductive type provided on the substrate; a Group III–V compound semiconductor active layer provided on the first boron-phosphide-based semiconductor layer; a second boron-phosphide-based semiconductor layer of a second conduction type provided on the active layer; and a top electrode provided on the surface of the second boron-phosphide-based semiconductor layer, wherein the top electrode includes a lower electrode and an upper electrode, the lower electrode is in direct contact with the second boron-phosphide-based semiconductor layer and formed of a metal incapable of establishing ohmic contact with the second boron-phosphide-based semiconductor layer, and the upper electrode is provided on the lower electrode and formed of a metal capable of establishing ohmic contact with the second boron-phosphide-based semiconductor layer, wherein a portion of the upper electrode is in contact with the surface of the second boron-phosphide-based semiconductor layer.

(2) A boron-phosphide-based semiconductor light-emitting device according to (1) above, wherein the first boron-phosphide-based semiconductor layer serves as a cladding layer for the active layer.

(3) A boron-phosphide-based semiconductor light-emitting device according to (1) or (2) above, which further comprises a buffer layer formed of an amorphous or polycrystalline boron-phosphide-based semiconductor layer provided between the semiconductor substrate and the first boron-phosphide-based semiconductor layer.

(4) A boron-phosphide-based semiconductor light-emitting device according to any one of (1) through (3) above, wherein the first boron-phosphide-based semiconductor layer, the active layer, and the second boron-phosphide-based semiconductor layer constitute a light-emitting portion of double hetero (DH) structure.

(5) A boron-phosphide-based semiconductor light-emitting device according to any one of (1) through (4) above, wherein the second boron-phosphide-based semiconductor layer is formed of p-type boron phosphide (BP), and the lower electrode is formed of a gold.germanium (Au.Ge) alloy, a gold.indium (Au.In) alloy, a gold.tin (Au.Sn) alloy, or an indium.tin composite oxide (ITO).

(6) A boron-phosphide-based semiconductor light-emitting device according to (5) above, wherein the upper electrode is formed of a gold.zinc (Au.Zn) alloy or a gold.beryllium (Au.Be) alloy.

(7) A boron-phosphide-based semiconductor light-emitting device according to any one of (1) through (4) above, wherein the second boron-phosphide-based semiconductor layer is formed of n-type BP, and the lower electrode is formed of a gold.zinc (Au.Zn) alloy or a gold.beryllium (Au.Be) alloy.

(8) A boron-phosphide-based semiconductor light-emitting device according to (7) above, wherein the upper electrode is formed of a gold.germanium (Au.Ge) alloy, a gold.indium (Au.In) alloy, or a gold.tin (Au.Sn) alloy.

(9) A boron-phosphide-based semiconductor light-emitting device according to any one of (1) through (4) above, wherein the lower electrode and the second boron-phosphide-based semiconductor layer are capable of establishing a Schottky junction.

(10) A boron-phosphide-based semiconductor light-emitting device according to (9) above, wherein the lower electrode is formed of nickel (Ni), tungsten (W), tantalum (Ta), aluminum (Al), titanium (Ti), gold (Au), titanium nitride (TiN), or tungsten carbide (WC).

The present invention also provides the following.

(11) A method for producing a boron-phosphide-based semiconductor light-emitting device comprising successively forming, on a semiconductor substrate of a first conduction type, a first boron-phosphide-based semiconductor layer of a first conduction type, a Group III–V compound semiconductor active layer, and a second boron-phosphide-based semiconductor layer of a second conduction type; forming a bottom electrode on the bottom surface of the semiconductor substrate; and forming a top electrode on the surface of the second boron-phosphide-based semiconductor layer, wherein a lower electrode containing a metal incapable of establishing ohmic contact with the second boron-phosphide-based semiconductor layer is formed to come into direct contact with the second boron-phosphide-based semiconductor layer, and subsequently an upper electrode containing a metal capable of establishing ohmic contact with the second boron-phosphide-based semiconductor layer is formed on the lower electrode such that a portion of the upper electrode comes into contact with the surface of the second boron-phosphide-based semiconductor layer.

(12) A method for producing a boron-phosphide-based semiconductor light-emitting device according to (11) above, wherein the first boron-phosphide-based semiconductor layer serves as a cladding layer for the active layer.

(13) A method for producing a boron-phosphide-based semiconductor light-emitting device according to (11) or (12) above, which further comprises forming, between the semiconductor substrate and the first boron-phosphide-based semiconductor layer, a buffer layer containing an amorphous or polycrystalline boron-phosphide-based semiconductor layer.

(14) A method for producing a boron-phosphide-based semiconductor light-emitting device according to any one of (11) through (13) above, wherein the first boron-phosphide-based semiconductor layer, the active layer, and the second boron-phosphide-based semiconductor layer constitute a light-emitting portion of double hetero (DH) structure.

The above object of the present invention has also been achieved by providing the following.

(15) A light-emitting diode comprising a boron-phosphide-based semiconductor light-emitting device as recited in any one of (1) through (10) above.

DETAILED DESCRIPTION OF THE INVENTION

Figure 1:
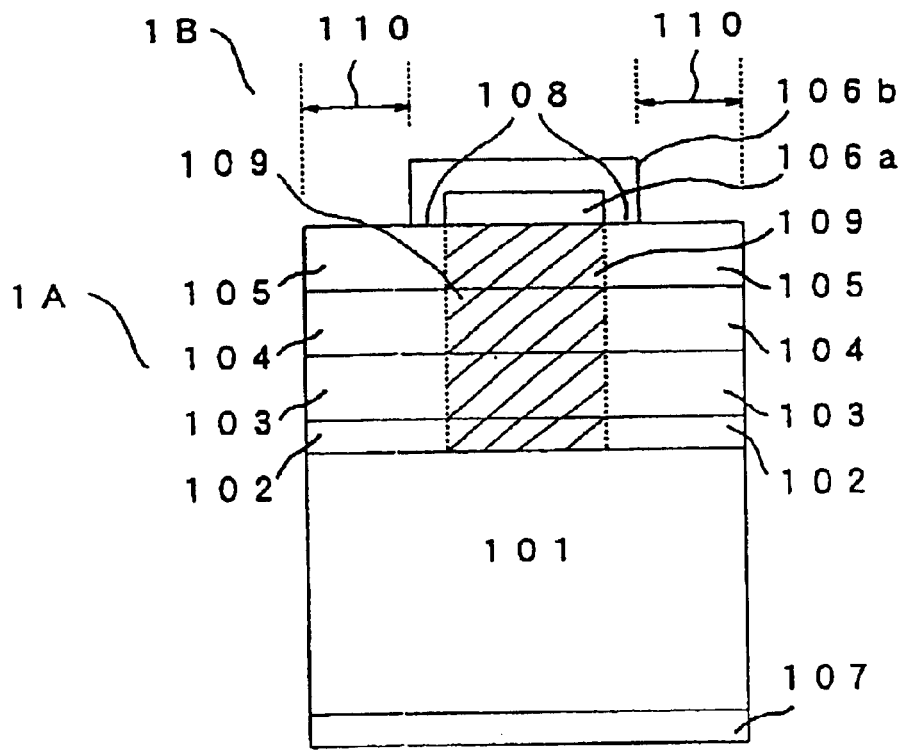
FIG. 1 is a schematic cross-sectional view showing an LED according to the present invention.

An embodiment of the present invention will now be described by taking, as an example, production of a boron-phosphide-based semiconductor light-emitting device (LED) from a stacked layer structure 1A shown in FIG. 1.

The stacked layer structure 1A for an LED of the present invention includes a substrate 101. The substrate 101 may be formed of single-crystal silicon (Si); or a single-crystal Group III–V compound semiconductor, such as gallium phosphide (GaP), gallium arsenide (GaAs), or boron phosphide (BP) (see (1) J. Electrochem. Soc., 120 (1973), pp. 802–806, and (2) U.S. Pat. No. 5,042,043). The crystalline plane orientation of the surface of a single-crystal material constituting the substrate 101 may be selected from among {100}, {110}, and {111}. When the substrate 101 is formed of an electrically conductive crystalline material, a positive or negative ohmic electrode can be provided as a bottom electrode 107 on the bottom surface of the substrate 101, and thus a light-emitting device can be readily formed. Particularly when the substrate 101 is formed of an electrically conductive single-crystal material having a specific resistance (resistivity) as low as 1 mΩ.cm or less (preferably 0.1 mΩ.cm or less), the resultant substrate 101 enables production of an LED having a low forward voltage (i.e., Vf). Since the substrate 101 exhibits excellent heat radiation ability, the substrate 101 is effectively employed for producing an LD exhibiting stable radiation.

Next will be described procedures for successively forming layers on the surface of the substrate 101. Firstly, a first boron-phosphide-based semiconductor layer 103 of first conduction type is formed on the single-crystal substrate 101 of first conduction type. As used herein, the expression "boron-phosphide-based semiconductor" refers to a semiconductor containing boron (B) and phosphorus (P) as constitutive elements; for example, a semiconductor represented by $B_\alpha Al_\beta Ga_\gamma In_{1-\alpha-\beta-\gamma} P_{1-\delta} As_\delta$ ($0 < \alpha \leq 1, 0 \leq \beta < 1$, $0 \leq \gamma < 1, 0 < \alpha+\beta+\gamma \leq 1, 0 \leq \delta < 1$), or a semiconductor represented by $B_{\alpha A/\beta}Ga_\gamma In_{1-\alpha-\beta-\gamma}P_{1-\delta}N_\delta$ ($0 < \alpha \leq 1$, $0 \leq \beta < 1$, $0 \leq \gamma < 1$, $0 < \alpha+\beta+\gamma \leq 1$, $0 \leq \delta < 1$). Particularly when the first boron-phosphide-based semiconductor layer is formed of a semiconductor having a band gap larger than that of a light-emitting layer 104, the first boron-phosphide-based semiconductor layer can serve as a cladding layer for the light-emitting layer. As used herein, the expression "active layer" refers to a light-emitting layer of the light-emitting device.

In the present invention, preferably, a cladding layer is formed of a boron-phosphide-based semiconductor whose band gap is larger at least than that of a light-emitting layer by about 0.2 eV to about 0.3 eV. For example, a boron-phosphide-based semiconductor of large band gap can be formed through metal-organic chemical vapor deposition (MOCVD) under the following conditions: growth rate: 2 nm/minute to 30 nm/minute, ratio of the feed amount of a Group V element (e.g., phosphorus) to that of a Group III element (e.g., boron) (i.e., V/III ratio): 15 to 60. A cladding layer for a light-emitting layer which emits blue light or light of longer wavelength can be advantageously produced from boron monophosphide which is formed under the aforementioned conditions and which has a band gap of about 3 eV at room temperature. The band gap of a boron-phosphide-based semiconductor is obtained on the basis of, for example, photon-energy dependence of an imaginary number portion of a complex dielectric constant ($\in_2 = 2.n.k$) calculated from refractive index (n) and extinction coefficient (k). When a cladding layer is formed of boron monophosphide, the carrier concentration of the cladding layer is preferably about $1 \times 10^{18}$ cm$^{-3}$ to about $5 \times 10^{19}$ cm$^{-3}$, regardless of its conduction type. The thickness of the cladding layer is preferably about 100 nm to about 1,000 nm.

The first boron-phosphide-based semiconductor layer 103 may be formed on a buffer layer 102 provided on the substrate 101. The buffer layer 102 is preferably formed of an amorphous or polycrystalline boron-phosphide-based semiconductor layer. The resultant amorphous or polycrystalline buffer layer 102 exerts the effect of relaxing lattice mismatching between the substrate 101 and the first boron-phosphide-based semiconductor layer, thereby reducing the density of crystal defects, such as misfit dislocation, in the first boron-phosphide-based semiconductor layer. Boron and phosphorus contained in the buffer layer serve as "nuclei for growth" for promoting growth of the first boron-phosphide-based semiconductor layer, and thus these elements exert the effect of forming the continuous first boron-phosphide-based semiconductor layer. The buffer layer is formed of, for example, amorphous or polycrystalline boron phosphide (BP) formed at 250° C. to 750° C. through a metal-organic chemical vapor deposition method (MOCVD method) (see U.S. Pat. No. 6,069,021). The thickness of the buffer layer 102 is preferably about 1 nm to 50 nm, more preferably 2 nm to 15 nm.

The light-emitting layer 104 containing a Group III–V compound semiconductor, such as gallium indium nitride ($Ga_X In_{1-X}N$: $0 \leq X \leq 1$), is formed on the first boron-phosphide-based semiconductor layer 103. The light-emitting layer 104 is formed of a layer having the first conduction type, or a second conduction type opposite the first conduction type. When the first boron-phosphide-based semiconductor layer 103 of first conduction type is joined to the light-emitting layer 104 of second conduction type, a light-emitting portion of single hetero (SH) junction structure is formed. The light-emitting layer may be formed of a single or multi quantum well structure including a well layer formed of ($Ga_X In_{1-X}N$: $0 \leq X \leq 1$) or gallium nitride phosphide ($GaN_{1-Y}P_Y$: $0 < Y \leq 1$). A barrier layer corresponding to the well layer may be formed of aluminum gallium nitride ($Al_X Ga_{1-X}N$: $0 \leq X \leq 1$) or $GaN_{1-Z}P_Z$ ($0 \leq Z < 1Z$, X<Y).

When a second boron-phosphide-based semiconductor layer 105 of second conduction type having a large band gap is provided on the light-emitting layer 104, a light-emitting portion of double hetero (DH) structure is formed. The second boron-phosphide-based semiconductor layer is formed of, for example, $B_\alpha Al_\beta Ga_\gamma In_{1-\alpha-\beta-\gamma}P_{1-\delta}As_\delta$ ($0 < \alpha \leq 1$, $0 \leq \beta < 1, 0 \leq \gamma < 1, 0 < \alpha+\beta+\gamma \leq 1, 0 \leq \delta < 1$), or $B_\alpha Al_\beta Ga_\gamma In_{1-\alpha-\beta-\gamma}P_{1-\delta}N_\delta$ ($0 < \alpha \leq 1, 0 \leq \beta < 1, 0 \leq \gamma < 1, 0 < \alpha+\beta+\gamma \leq 1, 0 < \delta < 1$). A stacked layer structure including the light-emitting layer and the first and second boron-phosphide-based semiconductor layers, the conduction types of the layers being opposite each other and each of the layers having a large band gap, can be employed for producing an LED including a light-emitting portion of pn-junction-type DH structure which emits light exhibiting an emission intensity higher than that of light emitted from a light-emitting portion of single hetero junction structure. Particularly when the first and second boron-phosphide-based semiconductor layers are formed of the same semiconductor material such that these layers have the same thickness, strain applied to the light-emitting layer—such strain is attributed to lattice mismatching between these semiconductor layers or to the difference in thermal expansion coefficient between these semiconductor layers—can be reduced. Thus, unwanted variation in the wavelength of light emitted from the light-emitting layer, which is attributed to lattice strain or thermal strain applied to the light-emitting layer, can be reduced.

A top electrode 106 of two-layer structure is provided on the surface of the second boron-phosphide-based semiconductor layer 105 of second conduction type, to thereby produce the light-emitting device of the present invention. A characteristic feature of the top electrode 106 resides in its structure including a lower electrode 106a and an upper electrode 106b formed thereon. The lower electrode 106a is formed of a metallic material capable of establishing ohmic contact with the boron-phosphide-based semiconductor layer 105 of first conduction type, which is opposite the second conduction type. For example, when the second boron-phosphide-based semiconductor layer is formed of undoped p-type boron monophosphide (BP), the lower electrode 106a is formed of a metallic material capable of establishing ohmic contact with an n-type boron-phosphide-based semiconductor layer, such as a gold alloy (e.g., a gold.germanium (Au.Ge) alloy, a gold.indium (Au.In) alloy, or a gold.tin (Au.Sn) alloy), or an indium.tin composite oxide (ITO). Meanwhile, when the second boron-phosphide-based semiconductor layer 105 is formed of n-type BP, the lower electrode 106a is formed of a gold alloy capable of establishing ohmic contact with a p-type boron-phosphide-based semiconductor layer, such as a gold.zinc (Au.Zn) alloy or a gold.beryllium (Au.Be) alloy. When the lower electrode and the second boron-phosphide-based semiconductor layer of second conduction type are formed as described above, ohmic contact is not established between the electrode and the semiconductor layer.

The upper electrode 106b provided on the lower electrode 106a is formed of a metallic material capable of establishing ohmic contact with the second boron-phosphide-based semiconductor layer of second conduction type. For example, when the second boron-phosphide-based semiconductor layer is formed of n-type boron monophosphide (BP), the upper electrode 106b is formed of a gold alloy such as a gold.germanium (Au.Ge) alloy, a gold.indium (Au.In) alloy, or a gold.tin (Au.Sn) alloy. Meanwhile, when the second boron-phosphide-based semiconductor layer is formed of a p-type BP layer, the upper electrode 106b is formed of a gold alloy such as a gold.zinc (Au.Zn) alloy or a gold.beryllium (Au.Be) alloy. When the lower electrode 106a and the upper electrode 106b are formed of alloys containing the same metal, the resultant top electrode 106 exhibits excellent adhesion. For example, when the lower electrode 106a is formed of an Au.Zn alloy, and the upper electrode 106b is formed of an Au.Ge alloy, the resultant top electrode 106 exhibits excellent adhesion.

In order to cause operation current to flow through the light-emitting device, a region of the upper electrode 106b must be brought into contact with the surface of the second boron-phosphide-based semiconductor layer 105. Specifically, the upper electrode 106b is brought into contact with the second boron-phosphide-based semiconductor layer 105 via a region 108 provided on a portion of the upper electrode 106b that is not in contact with the lower electrode 106a. In order to lower the ohmic contact resistance of the upper electrode 106b, the upper electrode 106b may be provided so as to come into contact with a contact layer. In this case, the contact layer must be formed of a layer of second conduction type. Preferably, the contact layer is formed of a transparent material such that light emitted from the light-emitting layer 104 effectively passes through the contact layer. The top electrode 106 may have a multi-layer structure including the lower electrode 106a, the upper electrode 106b, and an intermediate layer provided between the electrodes 106a and 106b. The intermediate layer may be formed of, for example, a metallic material or insulating material which can suppress diffusion of atoms constituting the lower and upper electrodes 106a and 106b. The top electrode 106 may have a multi-layer structure including the upper electrode 106b, and a layer which facilitates bonding of wire to the top electrode 106, the layer being provided on the upper electrode 106b. In this case, the layer provided on the upper electrode 106b is formed of an electrically conductive material which does not impede flow of operation current to the upper electrode 106b.

As described above, the lower electrode 106 a constituting the top electrode 106 does not establish ohmic contact with the second boron-phosphide-based semiconductor layer of second conduction type. Therefore, the lower electrode 106a exerts the effect of impeding flow of operation current—supplied via the upper electrode 106b—into the light-emitting portion. In the present invention, the upper electrode 106b establishes ohmic contact with the second boron-phosphide-based semiconductor layer at the region 108. Therefore, operation current preferentially flows through a region 110 other than a projection region 109 of the lower electrode 106a. The top electrode 106 is not provided in the region 110. Therefore, emitted light passes through the region 110 to the outside without being shielded by the top electrode 106. The upper electrode 106b exerts the effect of supplying operation current efficiently and preferentially to the region 110 from which emitted light is advantageously obtained. In order to facilitate wire bonding, preferably, the diameter of the circular upper electrode 106b is regulated to about 100 μm or more.

Even when the lower electrode 106a is formed of a material capable of establishing a Schottky junction with the second boron-phosphide-based semiconductor layer, a light-emitting device (particularly an LED) exhibiting excellent emission efficiency can be produced, for the following reason. A carrier depletion layer is formed as a result of formation of a Schottky junction, and thus flow of operation current to a region beneath the lower electrode 106a is impeded. Examples of the material capable of establishing a Schottky junction with the boron-phosphide-based semiconductor layer include metals such as nickel (Ni), tungsten (W), tantalum (Ta), aluminum (Al), titanium (Ti), and gold (Au); and alloys of these metals, such as titanium nitride (TiN) and tungsten carbide (WC). A material capable of establishing a Schottky junction with a Group III–V compound semiconductor such as gallium arsenide (GaAs) is suitable for forming the lower electrode 106a. A material which generates a large depletion space (i.e., high Schottky barrier) under zero bias is particularly suitable. Even when the lower electrode 106a is formed of a material capable of establishing a Schottky junction with the second boron-phosphide-based semiconductor layer, the upper electrode 106b is formed of a metallic material capable of establishing ohmic contact with the second boron-phosphide-based semiconductor layer of second conduction type. For example, when the lower electrode 106a is formed of Ni, the upper electrode 106b is formed of a gold alloy, to thereby produce the top electrode 106.

Figure 2:
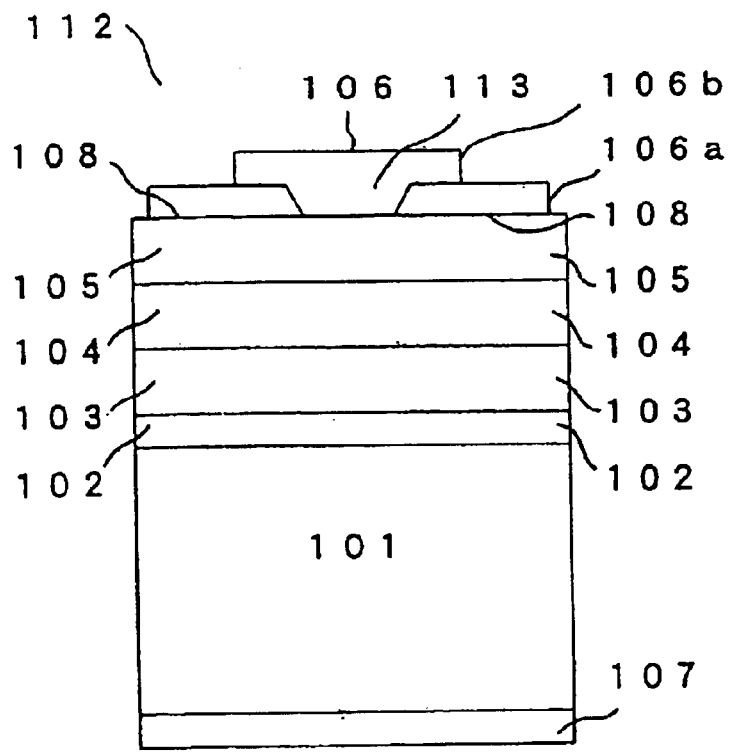
FIG. 2 is a schematic cross-sectional view showing a laser diode according to the present invention.

The lower electrode 106a may assume the shape of a circle, ellipse, square, rectangle, or polygon. The upper electrode 106b has a shape similar to that of the lower electrode 106a. When the top electrode having the aforementioned structure is employed in an LED, operation current is caused to flow throughout a region of the LED from which light is emitted. According to the present invention, a top electrode for a laser diode (LD) can be formed, which introduces operation current preferentially into a specific region of a light-emitting layer for inducing laser radiation. FIG. 2 is a schematic cross-sectional view showing a top electrode 106 employed for producing an LD 112, the top electrode including lower electrodes 106a and an upper electrode 106b provided thereon. As shown in FIG. 2, the lower electrodes 106a of the top electrode 106 are provided so as to be symmetrical with respect to a stripe region 113 formed on a center portion of the device (LD) 112. The surface of a second boron-phosphide-based semiconductor layer 105 is exposed at the stripe region 113. The upper electrode 106b is provided so as to come into contact with the lower electrodes 106a and the second boron-phosphide-based semiconductor layer 105 exposed at the stripe region 113. The lower electrodes 106a are formed of a material incapable of establishing ohmic contact or capable of establishing a Schottky junction with the second boron-phosphide-based semiconductor layer 105. Therefore, flow of operation current to a region beneath the lower electrodes 106a is impeded. The upper electrode 106b establishes ohmic contact with the second boron-phosphide-based semiconductor layer 105 at the stripe region 113. Therefore, operation current flows merely through a region at which the upper electrode 106b is in contact with the second boron-phosphide-based semiconductor layer 105; i.e., the stripe region 113. The top electrode having the aforementioned structure is employed for producing a current-constriction-type LD.

The lower electrode constituting the top electrode is formed of a material incapable of establishing ohmic contact or capable of establishing a Schottky junction with the second boron-phosphide-based semiconductor layer of second conduction type, and impedes the flow of operation current to a projection region of the top electrode shielding the emitted light. The upper electrode has a region at which ohmic contact is established between the upper electrode and the second boron-phosphide-based semiconductor layer of second conduction type, and the upper electrode exerts the effect of supplying operation current preferentially to a region from which emitted light is advantageously obtained.

EXAMPLES

Example 1

The present invention will be described in further detail with reference to the Examples. The present invention should not be limited thereto.

Figure 3:
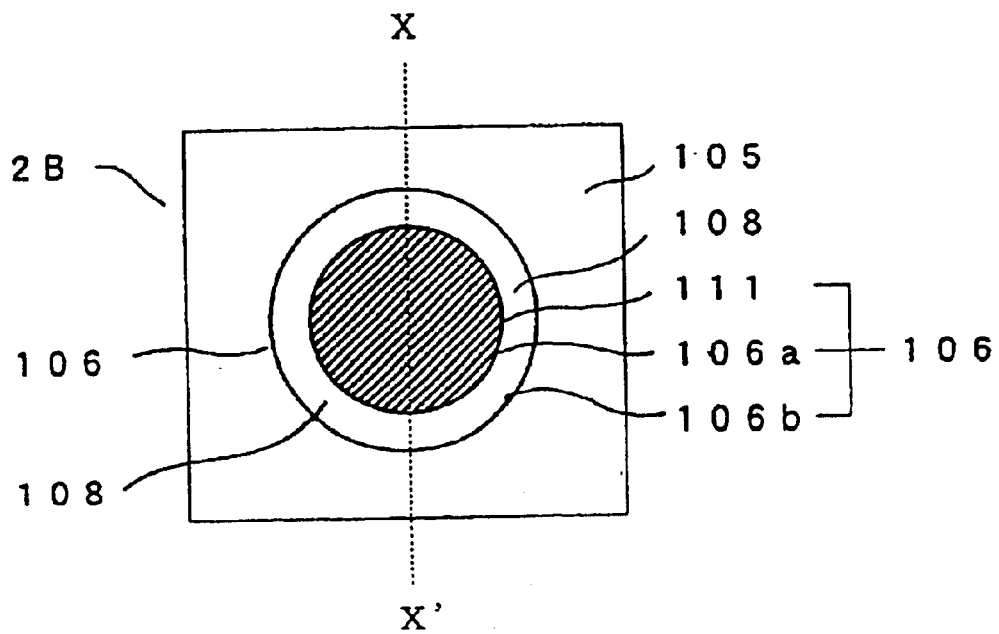
FIG. 3 is a schematic plan view showing an LED of Example 1.
Figure 4:
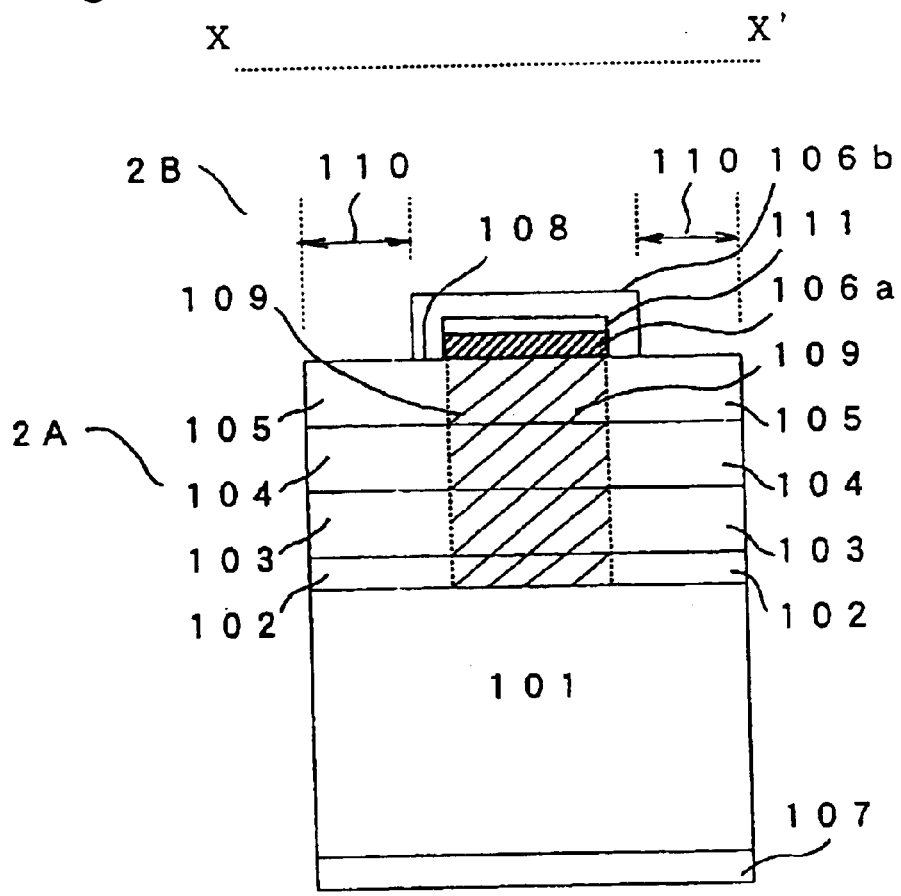
FIG. 4 is a schematic cross-sectional view of the LED shown in FIG. 3 taken along broken line X-X'.

The present invention will next be described in detail with reference to the following specific embodiment, in which an LED is produced. FIG. 3 shows a schematic plan view of an LED 2B of Example 1. FIG. 4 shows a schematic cross-sectional view of the LED 2B shown in FIG. 3 taken along broken line X–X'. Common structural elements constituting the stacked layer structure 1A shown in FIG. 1 and a stacked layer structure 2A shown in FIGS. 3 and 4 are denoted by the same reference numerals.

In the stacked layer structure 2A for the LED 2B, a substrate 101 was formed of antimony (Sb)-doped n-type single-crystal Si having a (111) crystal plane. In Example 1, n-type is a first conduction type. On the substrate 101, a boron phosphide buffer layer 102 (thickness: 5 nm) predominantly containing an amorphous structure in an as-grown state was formed. The buffer layer 102 was formed through a triethylboran $((C_2H_5)_3B)$/phosphine $(PH_3)$/hydrogen $(H_2)$ MOCVD method under atmospheric pressure at 350° C. On the surface of the buffer layer 102, a first boron-phosphide-based semiconductor layer 103 (thickness: about 330 nm) comprising an n-type boron phosphide (BP) layer was formed through the aforementioned MOCVD method at 1,050° C. The carrier concentration of the first boron-phosphide-based semiconductor layer 103 serving as an n-type cladding layer was regulated to about $8\times10^{18}$ $cm^{-3}$. The band gap of the BP layer constituting the first boron-phosphide-based semiconductor layer 103 at room temperature was found to be about 3.0 eV.

On the first boron-phosphide-based semiconductor layer 103, a light-emitting layer 104 (thickness: 50 nm) containing n-type gallium indium nitride ($Ga_{0.94}In_{0.06}N$) was formed. The light-emitting layer 104 was formed through a trimethylgallium $((CH_3)_3Ga)$/trimethylindium $((CH_3)_3In)$/ammonia $(NH_3)$/$H_2$ MOCVD method under atmospheric pressure at 850° C. On the surface of the light-emitting layer 104, a second boron-phosphide-based semiconductor layer 105 (thickness: about 330 nm) comprising p-type boron phosphide (BP) was formed. In Example 1, p-type is a second conduction type. The carrier concentration of the p-type second boron-phosphide-based semiconductor layer 105 was regulated to about $1\times10^{19}$ $cm^{-3}$. The second boron-phosphide-based semiconductor layer 105 was formed of boron monophosphide having a band gap at room temperature of about 3.0 eV. A light-emitting portion of pn-junction type double hetero (DH) structure was formed of the light-emitting layer 104, the first boron-phosphide-based semiconductor layer 103, and the second boron-phosphide-based semiconductor layer 105, the layers 103 and 105 having different conduction types.

A top electrode 106 was formed on a center portion of the surface of the p-type second boron-phosphide-based semiconductor layer 105. A lower electrode 106a constituting the top electrode 106 was formed of a gold (Au)-germanium (Ge) alloy capable of establishing ohmic contact with a layer of first conduction type (n-type in Example 1). The lower electrode 106a was formed of a circular Au.Ge vacuum deposition film (thickness: about 0.7 μm, diameter: 90 μm).

On the lower electrode 106a, a nickel (Ni) vacuum deposition film serving as an intermediate layer 111 (thickness: about 0.2 μm) was formed. The circular intermediate layer 111 (diameter: about 90 μm) was provided on the lower electrode 106a such that the center of the layer 111 coincides with that of the electrode 106a. An upper electrode 106b containing a gold.zinc (Au.Zn) alloy was formed on the intermediate layer 111. The upper electrode 106b was formed of a circular Au.Zn vacuum deposition film having a diameter greater than that of the lower electrode 106a; i.e., about 140 μm. The peripheral portion of the upper electrode 106b was brought into contact with the surface of the p-type second boron-phosphide-based semiconductor layer 105 such that ohmic contact was established between the electrode 106b and the layer 105. The thickness of the Au.Zn film constituting the upper electrode 106b was regulated to about 0.6 μm. The top electrode 106 was formed of the lower electrode 106a, the intermediate layer 111, and the upper electrode 106b.

An ohmic electrode containing an aluminum.antimony (Al.Sb) alloy, serving as a bottom electrode 107, was formed on almost the entire bottom surface of the n-type Si single-crystal substrate 101, to thereby produce the LED 2B. The thickness of the Al.Sb deposition film was regulated to about 2 μm. After the top electrode 106 and the bottom electrode 107 were formed, the LED 2B was subjected to cutting so as to form a square LED 2B chip having a size of about 350 μm×about 350 μm.

When an operation current of 20 mA was applied to the top electrode 106 and the bottom electrode 107 in a forward direction, light having a central emission wavelength of 420 nm was emitted from the LED chip. The luminance of the LED 2B chip was measured by use of a typical integrating sphere, and was found to be 9 mcd; i.e., the LED 2B exhibited high emission intensity. In Example 1, the lower electrode 106a of the top electrode 106 was formed of a material incapable of establishing ohmic contact with the p-type second boron-phosphide-based semiconductor layer 105, such that operation current flowed preferentially to a region 110. Therefore, the resultant LED emitted light of uniform intensity from the region 110.

Example 2

Figure 5:
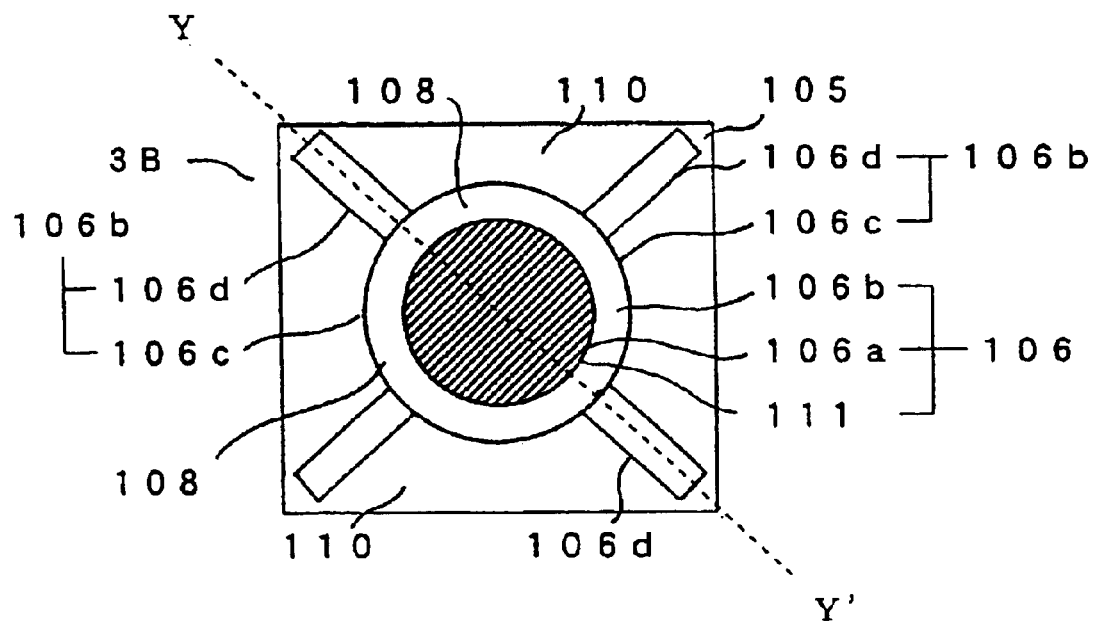
FIG. 5 is a schematic plan view showing an LED of Example 2.
Figure 6:
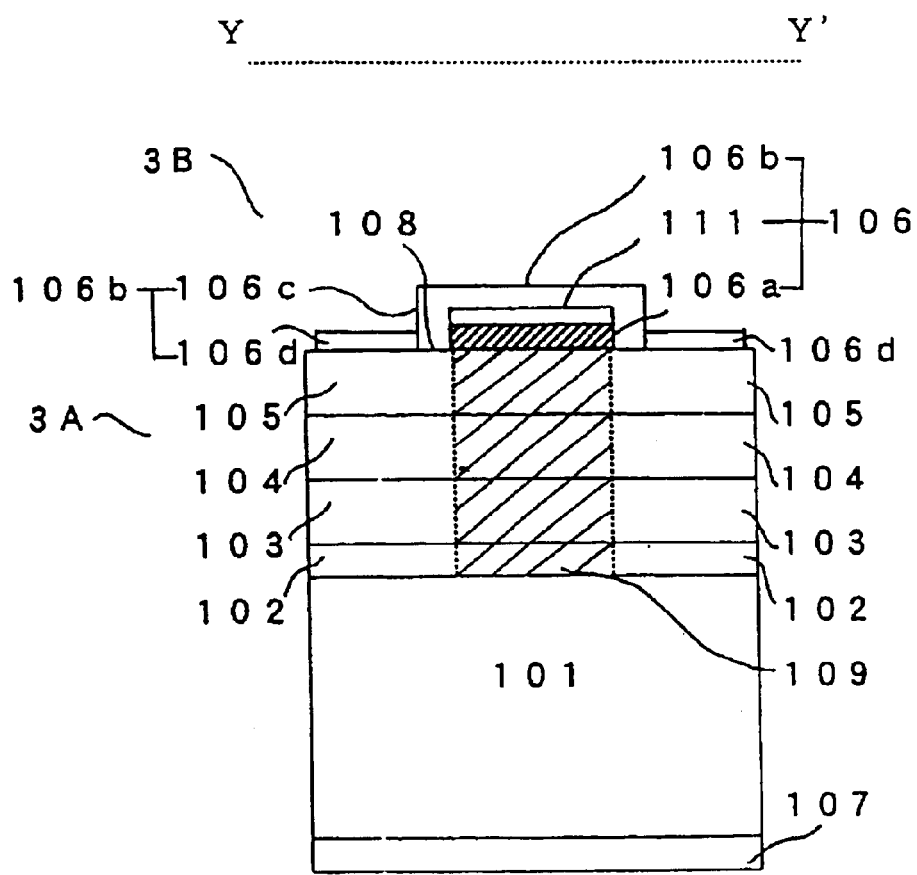
FIG. 6 is a schematic cross-sectional view of the LED shown in FIG. 5 taken along broken line Y-Y'.

The present invention will next be described in detail with reference to the following specific embodiment in which an LED is produced. FIG. 5 shows a schematic plan view of an LED 3B of Example 2. FIG. 6 shows a schematic cross-sectional view of the LED 3B shown in FIG. 5 taken along broken line Y-Y'. Common structural elements constituting the stacked layer structure 1A shown in FIG. 1 and a stacked layer structure 3A shown in FIGS. 5 and 6 are denoted by the same reference numerals.

In the stacked layer structure 3A for the LED 3B, a substrate 101 was formed of boron (B)-doped p-type single-crystal Si having a (111) crystal plane. In Example 1, p-type is a first conduction type. On the substrate 101 a boron phosphide buffer layer 102 (thickness: 5 nm) predominantly containing an amorphous structure in an as-grown state was formed. The buffer layer 102 was formed through a triethylboran $((C_2H_5)_3B)$/phosphine $(PH_3)$/hydrogen $(H_2)$ MOCVD method under atmospheric pressure at 350° C. On the surface of the buffer layer 102, a first boron-phosphide-based semiconductor layer 103 (thickness: about 430 nm) comprising a p-type boron phosphide (BP) layer was formed through the aforementioned MOCVD method at 1,050° C. The carrier concentration of the first boron-phosphide-based semiconductor layer 103 serving as a p-type cladding layer was regulated to about $2\times10^{19}$ cm$^{-3}$. The band gap of the BP layer constituting the first boron-phosphide-based semiconductor layer 103 at room temperature was found to be about 3.0 eV.

On the first boron-phosphide-based semiconductor layer 103, a light-emitting layer 104 (thickness: 100 nm) comprising n-type gallium phosphide nitride (GaN$_{0.95}$N$_{0.05}$) was formed. The light-emitting layer 104 was formed through a trimethylgallium ((CH$_3$)$_3$Ga)/PH$_3$/ammonia (NH$_3$)/H$_2$ MOCVD method under atmospheric pressure at 850° C. The band gap of the light-emitting layer 104 at room temperature was found to be about 2.95 eV. On the surface of the light-emitting layer 104, a second boron-phosphide-based semiconductor layer 105 (thickness: about 430 nm) containing n-type boron phosphide (BP) was formed. In Example 2, n-type is a second conduction type. The carrier concentration of the n-type second boron-phosphide-based semiconductor layer 105 was regulated to about $8\times10^{18}$ cm$^{-3}$. The second boron-phosphide-based semiconductor layer 105 was formed of boron monophosphide having a band gap at room temperature of about 3.0 eV. A light-emitting portion of pn-junction type double hetero (DH) structure was formed of the light-emitting layer 104, the first boron-phosphide-based semiconductor layer 103, and the second boron-phosphide-based semiconductor layer 105, the layers 103 and 105 having different conduction types.

A top electrode 106 was formed on a center portion of the surface of the n-type second boron-phosphide-based semiconductor layer 105. A lower electrode 106a constituting the top electrode 106 was formed of titanium (Ti) capable of establishing a Schottky junction with the second boron-phosphide-based semiconductor layer 105. The lower electrode 106a was formed of a Ti electron beam deposition film (thickness: about 0.5 μm, diameter about 100 μm). An aluminum (Al) vacuum deposition film serving as an intermediate layer 111 (thickness: about 0.3 μm) was formed on the lower electrode 106a. The circular intermediate layer 111 (diameter: about 100 μm) was provided on the lower electrode 106a such that the center of the layer 111 coincides with that of the electrode 106a. On the intermediate layer 111 was formed an upper electrode 106b containing a gold.germanium (Au.Ge) alloy capable of establishing ohmic contact with the second boron-phosphide-based semiconductor layer 105 of second conduction type (n-type in Example 2). As shown in FIG. 5, the upper electrode 106b was formed of a circular center electrode 106c, and rectangular electrodes 106d which are electrically connected to the center electrode 106c and which extend along diagonals of the LED 3B. The diameter of the circular center electrode 106c was regulated to be greater than that of the lower electrode 106a or the intermediate layer 111; i.e., about 150 μm. The peripheral portion of the center electrode 106c and the rectangular electrodes 106d were brought into contact with the surface of the n-type second boron-phosphide-based semiconductor layer 105 such that ohmic contact was established between the electrodes 106c and 106d, and the layer 105. The thickness of the Au.Ge film constituting the upper electrode 106b was regulated to about 0.6 μm. The top electrode 106 was formed of the lower electrode 106a, the intermediate layer 111, and the upper electrode 106b.

An ohmic electrode containing aluminum (Al), serving as a bottom electrode 107, was formed on almost the entire bottom surface of the p-type Si single-crystal substrate 101, to thereby produce the LED 3B. The thickness of the Al vacuum deposition film was regulated to about 3 μm. After the top electrode 106 and the bottom electrode 107 were formed, the LED 3B was subjected to cutting so as to form a square LED 3B chip having a size of about 350 μm×about 350 μm.

When an operation current of 20 mA was applied to the top electrode 106 and the bottom electrode 107 in a forward direction, light having a central emission wavelength of 420 nm was emitted from the LED chip. Since the first boron-phosphide-based semiconductor layer 103—which forms a hetero junction with the light-emitting layer 104 and serves as a cladding layer—and the second boron-phosphide-based semiconductor layer 105 have the same thickness and are formed of the same material, the central emission wavelength of the LED corresponds to the band gap of the light-emitting layer. The luminance of the LED 3B chip was measured using a typical integrating sphere, and was found to be 9 mcd; i.e., the LED 3B exhibited high emission intensity. In Example 2, the lower electrode 106a of the top electrode 106 was formed of a material capable of establishing a Schottky junction with the n-type second boron-phosphide-based semiconductor layer 105 such that operation current was caused to flow preferentially to a region 110. Therefore, the resultant LED emitted light of uniform intensity from the region 110. Forward voltage (i.e., Vf) was measured on the basis of current-voltage (I–V) characteristics, and found to be 3.6 V (forward current=20 mA). Reverse voltage was found to be 7 V (reverse current= 10 μA). Therefore, the LED 3B exhibited high breakdown voltage.

Effects of the Invention

According to the present invention, a light-emitting device is produced by forming a top electrode on a boron-phosphide-based semiconductor layer provided on a semiconductor substrate, the top electrode including a lower electrode which does not establish ohmic contact or which establishes a Schottky junction with the boron-phosphide-based semiconductor layer, and an upper electrode which establishes ohmic contact with the boron-phosphide-based semiconductor layer and is formed on the lower electrode. Therefore, when a boron-phosphide-based semiconductor light-emitting device (e.g., an LED) is produced through the method of the present invention, operation current can be caused to flow preferentially to a region of the device from which light is advantageously emitted, and thus the light-emitting device exhibits high emission intensity.

While the invention has been described in detail and with reference to specific embodiments thereof, it will be apparent to one skilled in the art that various changes and modifications can be made therein without departing from the spirit and scope thereof. This application is based on Japanese Patent Application No. P2002-20824 filed Jan. 30, 2002. The disclose of which is imported herein by reference in its entirety.

What is claimed is:

1. A boron-phosphide-based semiconductor light-emitting device comprising a semiconductor substrate of a first conduction type having, on its bottom surface, a bottom electrode; a first boron-phosphide-based semiconductor layer of a first conductive type provided on the substrate; a Group III–V compound semiconductor light-emitting layer provided on the first boron-phosphide-based semiconductor layer; a second boron-phosphide-based semiconductor layer of a second conductive type provided on the active layer; and a top electrode provided on the top surface of the second boron-phosphide-based semiconductor layer, wherein each of the boron-phosphide-based semiconductor layers serves as a cladding layer for the light-emitting layer, the cladding layer is formed of a boron-phosphide-based semiconductor whose band gap is larger at least than that of the light-emitting layer by 0.2 eV to 0.3 eV, the top electrode includes a lower electrode and an upper electrode, the lower electrode is in direct contact with the second boron-phosphide-based semiconductor layer and formed of a metal incapable of establishing ohmic contact with the second boron-phosphide-based semiconductor layer, and the upper electrode is provided on the lower electrode and formed of a metal capable of establishing ohmic contact with the second boron-phosphide-based semiconductor layer, wherein a portion of the upper electrode is in contact with the surface of the second boron-phosphide-based semiconductor layer.

2. The boron-phosphide-based semiconductor light-emitting device according to claim 1, wherein each of the boron-phosphide-based semiconductor layers is formed of boron monophosphide.

3. The boron-phosphide-based semiconductor light-emitting device according to claim 1, wherein the carrier concentration of each of the boron-phosphide-based semiconductor layers is $1 \times 10^{18}$ cm$^{-3}$ to $5 \times 10^{19}$ cm$^{-3}$ and the thickness is 100 nm to 1,000 nm.

4. The boron-phosphide-based semiconductor light-emitting device according to claim 1, wherein the first boron-phosphide-based semiconductor layer, the light-emitting layer, and the second boron-phosphide-based semiconductor layer constitute a light-emitting portion having a double hetero (DH) structure and the first and second boron-phosphide-based semiconductor layers are formed of the same semiconductor material except for their conductive types and the same thickness.

5. The boron-phosphide-based semiconductor light-emitting device according to claim 1, wherein the light-emitting layer is formed of a single or multi quantum well structure including a well layer formed of ($Ga_X In_{1-X} N$: $0 \leq X \leq 1$) or gallium nitride phosphide ($GaN_{1-Y} P_Y$: $0 < Y \leq 1$) and a barrier layer corresponding to the well layer is formed of aluminum gallium nitride ($Al_X Ga_{1-X} N$: $0 \leq X \leq 1$) or ($GaN_{1-Z} P_Z$: $0 \leq Z \leq 1$, $Z < Y$).

* * * * *